United States Patent
Lee et al.

(10) Patent No.: US 10,978,111 B1
(45) Date of Patent: Apr. 13, 2021

(54) SENSE AMPLIFIER CIRCUIT WITH REFERENCE VOLTAGE HOLDING CIRCUIT FOR MAINTAINING SENSE AMPLIFIER REFERENCE VOLTAGE WHEN THE SENSE AMPLIFIER OPERATES UNDER STANDBY MODE

(71) Applicant: Winbond Electronics Corp., Taichung (TW)

(72) Inventors: Poongyeub Lee, San Jose, CA (US); Ting-Kuo Yen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/705,147

(22) Filed: Dec. 5, 2019

(51) Int. Cl.
| | |
|---|---|
| *G11C 7/14* | (2006.01) |
| *G11C 7/06* | (2006.01) |
| *G11C 5/14* | (2006.01) |
| *G11C 16/26* | (2006.01) |
| *G11C 16/28* | (2006.01) |

(52) U.S. Cl.
CPC ............. *G11C 7/062* (2013.01); *G11C 5/147* (2013.01); *G11C 5/148* (2013.01); *G11C 16/26* (2013.01); *G11C 16/28* (2013.01)

(58) Field of Classification Search
CPC ......... G11C 7/062; G11C 5/147; G11C 5/148; G11C 16/26; G11C 16/28
See application file for complete search history.

(56) References Cited

U.S. PATENT DOCUMENTS

| | | | | |
|---|---|---|---|---|
| 5,523,978 A | * | 6/1996 | Yoon | G11C 7/22 365/229 |
| 5,917,765 A | * | 6/1999 | Morishita | G11C 5/147 365/201 |
| 6,819,612 B1 | * | 11/2004 | Achter | G11C 7/065 365/189.11 |
| 7,184,348 B2 | * | 2/2007 | Crippa | G11C 11/5642 365/189.15 |
| 8,565,038 B2 | * | 10/2013 | Tran | G11C 7/062 365/210.11 |

(Continued)

FOREIGN PATENT DOCUMENTS

| | | |
|---|---|---|
| CN | 103199799 | 12/2015 |
| TW | 200415851 | 8/2004 |

*Primary Examiner* — Mushfique Siddique
(74) *Attorney, Agent, or Firm* — JCIPRNET

(57) ABSTRACT

In an aspect of the disclosure, a reference voltage holding circuit is provided. The reference voltage holding circuit is for maintaining a sense amplifier reference voltage provided by a sense amplifier reference circuit, and the reference voltage holding circuit includes: a reference voltage generating circuit configured to provide a bias reference voltage; a current generating circuit electrically coupled to the reference voltage generating circuit and configured to receive the bias reference voltage to output a standby bias voltage and a standby bias current; and a voltage pull-up circuit electrically coupled to the current mirror circuit and configured to provide for the standby bias current and to maintain the standby bias voltage which drives the sense amplifier reference voltage when reference voltage holding circuit operates under a standby operation and approximates the sense amplifier reference voltage as long as the sense amplifier reference voltage remains enabled.

18 Claims, 3 Drawing Sheets

(56) References Cited

U.S. PATENT DOCUMENTS

| | | | | |
|---|---|---|---|---|
| 9,423,812 | B2* | 8/2016 | Slezak | H02M 3/156 |
| 2002/0075724 | A1* | 6/2002 | Pekny | G11C 16/28 |
| | | | | 365/185.02 |
| 2003/0081461 | A1* | 5/2003 | Yamauchi | G11C 11/4072 |
| | | | | 365/189.09 |
| 2003/0142568 | A1* | 7/2003 | Giove | G11C 7/067 |
| | | | | 365/207 |
| 2006/0017496 | A1* | 1/2006 | Yamada | G05F 1/465 |
| | | | | 327/540 |
| 2007/0070769 | A1 | 3/2007 | Braceras et al. | |
| 2014/0036596 | A1* | 2/2014 | Chan | G11C 16/28 |
| | | | | 365/185.21 |

* cited by examiner

SENSE AMPLIFIER CIRCUIT WITH REFERENCE VOLTAGE HOLDING CIRCUIT FOR MAINTAINING SENSE AMPLIFIER REFERENCE VOLTAGE WHEN THE SENSE AMPLIFIER OPERATES UNDER STANDBY MODE

TECHNICAL FIELD

The disclosure is directed to a reference voltage holding circuit and a sense amplifier circuit having the reference voltage holding circuit.

BACKGROUND

For a conventional non-volatile memory integrated circuit, a sense amplifier is generally an essential part of a read mechanism which enables a binary data stored in a memory cell to read. A sense amplifier is designed to sense a low power signal from a bit line which represents either a binary 1 or a binary 0 stored in a memory cell and to amplify the low power signal into a recognizable voltage level so as to enable a circuit that is a part of the read mechanism to discern the binary data stored within the memory cell.

A sense amplifier architecture may have many implementations. One implementation may adopt using not limited to multiple main sense amplifier circuits with each connected to a memory cell and a sense amplifier reference circuit providing a reference voltage for each of the multiple main sense amplifier circuits. Each one of the main sense amplifier circuits is connected to a memory cell. A main sense amplifier circuit may include not limited to a comparator and a current to voltage converter (IV converter), and a sense amplifier reference circuit may include not limited to an IV converter. The output of the sense reference circuit could be connected to an input of each of the comparators of the main sense amplifier circuit. In general, a comparator would compare a voltage signal stored in a memory cell of a main sense amplifier circuit with a reference voltage generated by a sense amplifier reference circuit. If the voltage signal stored in the memory cell is smaller than the reference voltage, then the comparator would generate a binary 1; otherwise, the comparator would generate a binary 0.

The main sense amplifier circuits and the sense amplifier reference circuit would typically be turned off during a standby mode so as to achieve power saving but would otherwise be on during an active read mode. When the chip enters from the standby mode to the active read mode, there is a time limit for the reference voltage to reach a voltage target. If the voltage target is not reached within the time limit, the main sense amplifier circuits might not function correctly. However, a trend has required more and more main sense amplifier circuits to be placed within an area of integrated circuit. Since increasing the number of main sense amplifier circuits connected to a sense amplifier reference circuit may result in a higher overall capacitive load from the perspective of the sense amplifier reference circuit, the time limit could be getting more and more difficult to reach as the number of main sense amplifier circuits increases and as the external clock driving the memory chip gets faster.

One alternative solution to meet the above described challenge could be to divide the main sense amplifier circuits into multiple groups with a smaller number of main sense amplifier circuits being connected to a reference sense amplifier circuit. However, such endeavor might not be satisfactory as the overall system may require a higher current consumption as well as more sense amplifier reference circuits. Therefore, alternative solutions could still be proposed in order to meet the above described challenge.

SUMMARY OF THE DISCLOSURE

Accordingly, the disclosure is directed to a reference voltage holding circuit and a sense amplifier circuit having the reference voltage holding circuit.

In an aspect of the disclosure, the reference voltage holding circuit is provided for maintaining a sense amplifier reference voltage provided by a sense amplifier reference circuit, and the reference voltage holding circuit includes not limited to: a reference voltage generating circuit configured to provide a bias reference voltage; a current generating circuit electrically coupled to the reference voltage generating circuit and configured to receive the bias reference voltage to output a standby bias voltage and a standby bias current; and a voltage pull-up circuit electrically coupled to the current mirror circuit and configured to provide for the standby bias current and to maintain the standby bias voltage which drives the sense amplifier reference voltage when reference voltage holding circuit operates under a standby operation and approximates the sense amplifier reference voltage as long as the sense amplifier reference voltage remains enabled.

In another aspect of the disclosure, a sense amplifier circuit is provided. The sense amplifier circuit includes not limited to: a sense amplifier reference circuit configured to generate a sense amplifier reference voltage; a main sense amplifier circuit configured to receive the sense amplifier reference voltage and to amplify a signal stored in a memory cell of the main sense amplifier circuit by using the sense amplifier reference voltage; and a reference voltage holding circuit configured to maintain the sense amplifier reference voltage when the sense amplifier operates under a standby operation, wherein the reference voltage holding circuit including: a reference voltage generating circuit configured to provide a bias reference voltage; a current mirror circuit electrically coupled to the reference voltage generating circuit and configured to receive the bias reference voltage to output a standby bias voltage and a standby bias current; and a voltage pull-up circuit electrically coupled to the current mirror circuit and configured to provide for the standby bias current and to pull-up the standby bias voltage which drives the sense amplifier reference voltage when reference voltage holding circuit operates under a standby operation and approximates the sense amplifier reference voltage as long as the sense amplifier reference voltage remains enabled.

In order to make the aforementioned features and advantages of the present disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the present disclosure and is therefore not meant to be limiting or restrictive in any manner. Also, the present disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
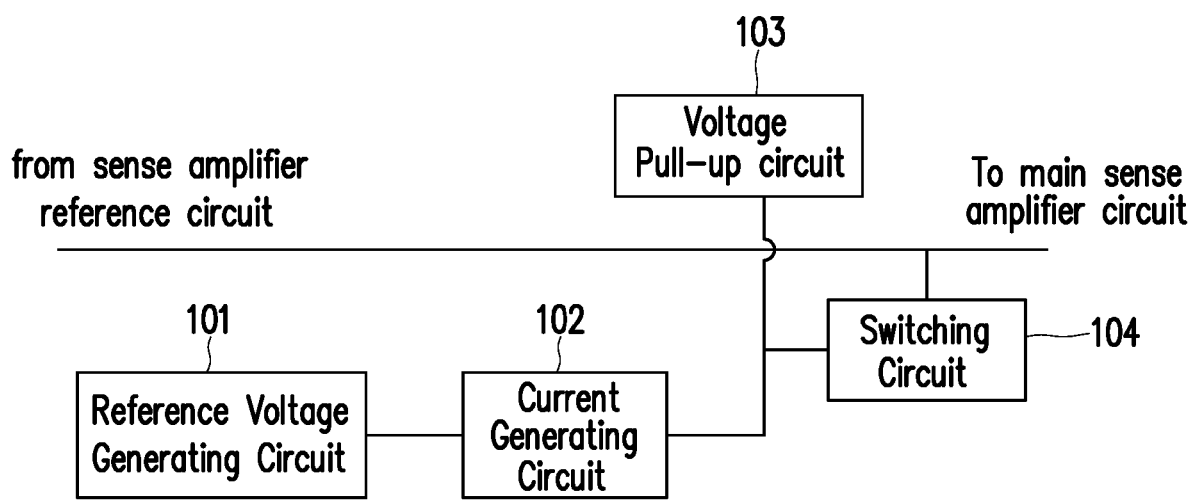
FIG. 1 illustrates a conceptual diagram of a reference voltage holding circuit according to an aspect of the disclosure.

Reference will now be made in detail to the present exemplary embodiments of the disclosure, examples of which are illustrated in the accompanying drawings. Wherever possible, the same reference numbers are used in the drawings and the description to refer to the same or like parts.

As previously the described, since the future non-volatile memory storage device requires higher and higher speed as well as more data throughput, the timing requirement becomes more difficult to fulfill as the number of sense amplifiers increases. Also, as the number of sense amplifiers increases, the overall capacitance of the sense amplifiers also increases which would lead to a slower ramp up rate of the sense amplifier reference voltage. The slowing of the ramp up rate of the sense amplifier reference voltage may lead to a malfunction of an initial read operation. In order to meet the challenge of having an increased number of sense amplifiers and at the same time mitigate the negative consequences of such increase, the disclosure proposes modifying an sense amplifier circuit by adding a reference voltage holding circuit which holds the sense amplifier reference voltage when operating under a standby mode during which both the sense amplifier reference circuit and the main sense amplifier circuit are turned off in order to avoid needless power consumption. In this disclosure, the reference voltage holding circuit which avoids the slow ramp up rate of the sense amplifier reference voltage by maintaining the voltage level of the sense amplifier reference voltage when the non-volatile memory storage device undergoes a transition from the standby mode into an active read mode.

FIG. 1 shows a conceptual diagram of a reference voltage holding circuit 100 configured for maintaining a sense amplifier reference voltage provided by a sense amplifier reference circuit (which is not shown as the sense amplifier reference circuit is connected to but external to the reference voltage holding circuit 100). The reference voltage holding circuit 100 would include not limited to a reference voltage generating circuit 101 configured to provide a bias reference voltage, a current generating circuit 102 electrically coupled to the reference voltage generating circuit 101 and configured to receive the bias reference voltage to output a standby bias voltage and a standby bias current, and a voltage pull-up circuit 103 electrically coupled to the current generating circuit 102 and configured to provide for the standby bias current and to pull-up the standby bias voltage which drives the sense amplifier reference voltage when reference voltage holding circuit 100 operates under a standby operation and approximates the sense amplifier reference voltage as long as the sense amplifier reference circuit remains enabled. When the sense amplifier reference circuit turned off during the standby operation, the sense amplifier reference voltage is maintained by the reference voltage holding circuit 100.

According to an exemplary embodiment, the reference voltage generating circuit 101 may include a bandgap voltage reference circuit which generates a bias reference voltage that is turned on while the reference voltage holding circuit 100 operates under both a standby operation and a read operation. According to an exemplary embodiment, the current generating circuit 102 could be a current mirror circuit which includes multiple transistors configured to receive the bias reference voltage and converts the bias reference voltage into a standby bias current which is set to be N times less than a reference current of a reference cell of the sense amplifier reference circuit. Alternatively, the current generating circuit 102 may also be a resistor which converts the bias reference voltage into a standby bias current which is set to be N times less than a reference current of a reference cell of the sense amplifier reference circuit According to an exemplary embodiment, the voltage pull-up circuit 103 may include a first P-type transistor which pulls up the standby bias voltage by setting the first P-type transistor to have a width over length ratio to be N times less than a width over length ratio of a corresponding P-type transistor of the sense amplifier reference circuit. The number N could be set to meet the current consumption target for a reference voltage holding circuit (e.g. 302) during the standby mode. According to an exemplary embodiment, the voltage pull-up circuit 103 may further include a second P-type transistor which has a first terminal, a second terminal, and a third terminal with the first terminal being connected to a drain to drain voltage (vdd), a second terminal being connected to the first P-type transistor, and a third terminal being configured to receive a deep power down signal which is kept low to keep the second P-type transistor turned on as long as the reference voltage holding circuit is not deeply powered down. If the deep power down signal is pull high to turn off the second P-type transistor, then the voltage pull-up circuit 103 would cease providing the standby bias current during the deep powered down mode.

According to an exemplary embodiment, the switching circuit 104 would be configured to couple the standby bias voltage to the sense amplifier reference voltage during the standby mode but to decouple the standby bias voltage from the sense amplifier reference voltage during a read operation during which the sense amplifier reference voltage is driven by the sense amplifier reference circuit and is not driven by the reference voltage holding circuit.

Figure 2A:
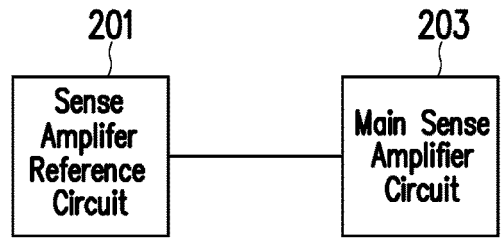
FIG. 2 illustrates a conceptual diagram of a sense amplifier circuit according to an aspect of the disclosure.
Figure 2B:
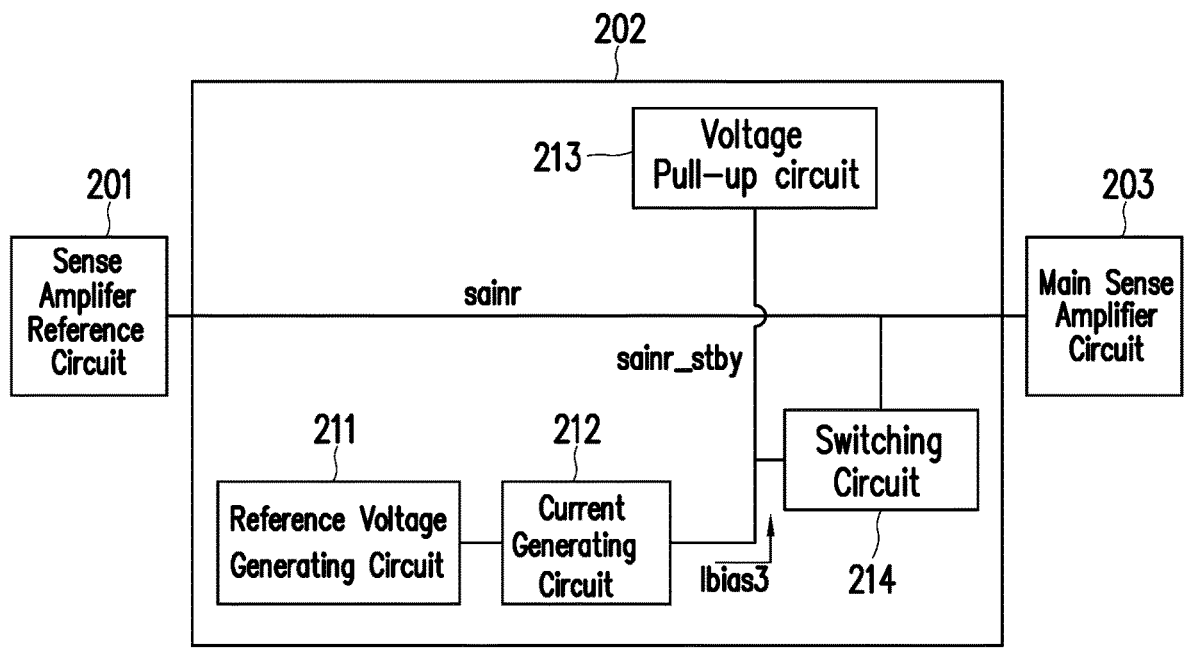
Figure 3:
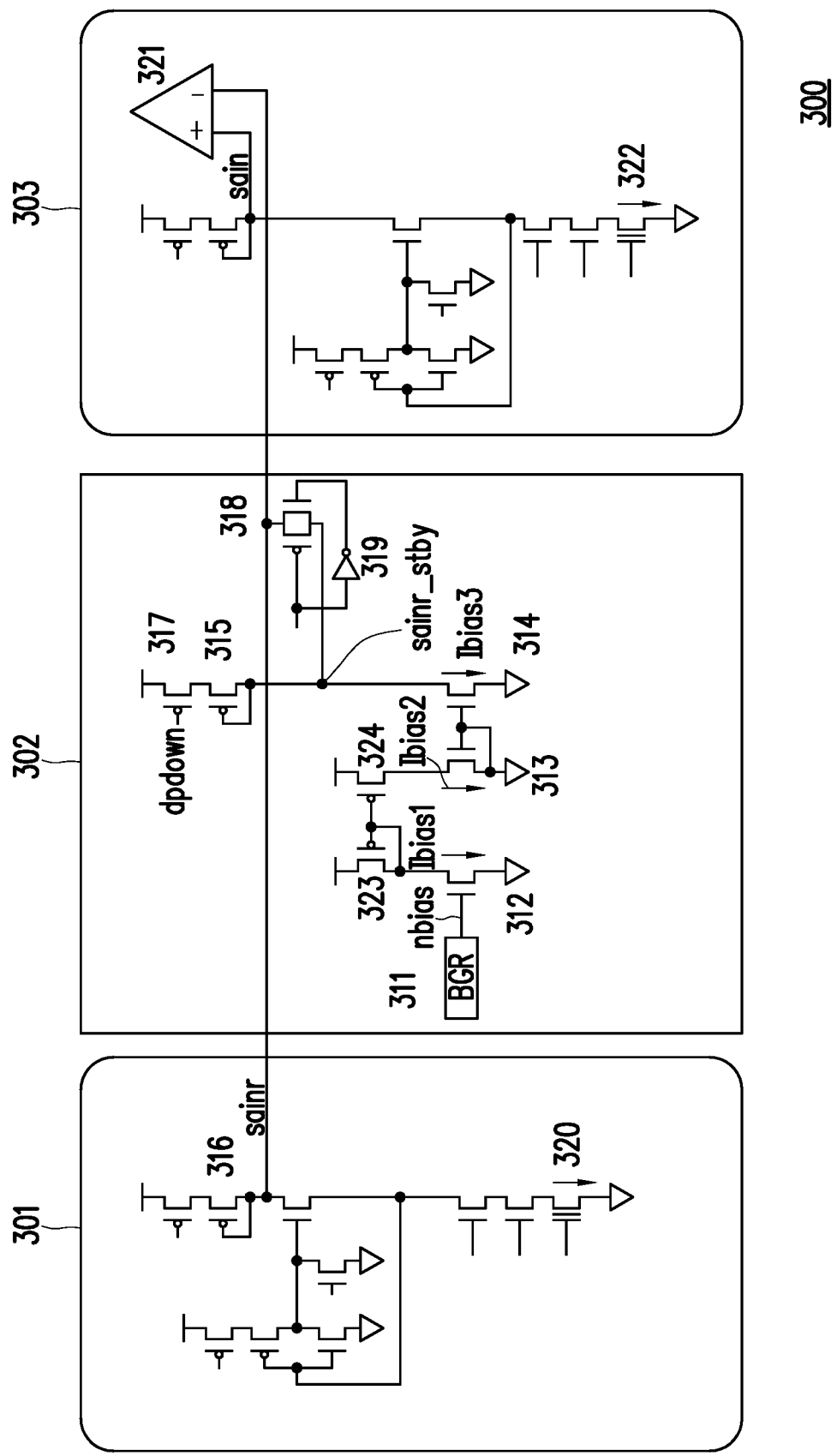
FIG. 3 illustrates a sense amplifier having a reference voltage holding circuit according to an exemplary embodiment of the disclosure.

FIG. 2 illustrates a conceptual diagram of an entire sense amplifier circuit 200, and FIG. 3 shows the circuits of the amplifier circuit 200 in further details. FIG. 2 and FIG. 3 are referred to together in the following disclosure. The sense amplifier circuit 200 300 would include not limited to a sense amplifier reference circuit 201 301 configured to generate a sense amplifier reference (sainr) voltage, a main sense amplifier circuit 203 303 configured to receive the sainr voltage and to generate a voltage signal (sain) by converting a cell current 322 from a memory cell of the main sense amplifier circuit 203 303 and to compare the sain voltage with the sainr voltage through a comparator 321, and a reference voltage holding circuit 302 configured to maintain the sainr voltage when the sense amplifier 200 300 operates under a standby operation.

The reference voltage holding circuit 202 302 would include not limited to a reference voltage generating circuit 211 configured to provide a bias reference (nbias) voltage, a current generating circuit 212 electrically connected to the reference voltage generating circuit 211 and configured to receive the nbias voltage to output a standby bias (sainr_stby) voltage and a standby bias (Ibias3) current, and a voltage pull-up circuit 213 electrically coupled to the current generating circuit 212 and configured to provide for the Ibias3 current and to pull-up the sainr_stby voltage which drives the sainr voltage when reference voltage holding circuit 202 302 operates under the standby operation and approximates the sainr voltage as long as the sense amplifier reference circuit 201 301 remains enabled.

It is worth noting that the sense amplifier reference circuit 201 301 and the main sense amplifier circuit 203 303 are both turned off during a standby mode so as to reduce power consumption. During the standby mode, the sense amplifier reference circuit 201 301 could be floating and sainr voltage is determined by the contention between a first Ioff current 316 and a second Ioff current 320. For example, if the first Ioff 316 is higher than the second Ioff 320, sainr could be close to vdd. Otherwise if the first Ioff 316 is less than the second Ioff 320, then sainr could be close to ground. When the sense amplifier reference circuit 201 301 and the main sense amplifier circuit 203 303 exit the standby mode and go into an active read mode, the sainr requires hardly any time to charge up or down since the reference voltage holding circuit 202 302 either upholds the sainr voltage. Thus, even if the sense amplifier reference circuit 201 301 has to provide sainr to many main sense amplifier circuits (e.g. 203 303), the sainr would require significantly less time to charge without having to slow down the clock frequency for read operation or resort to a tactic such as adding additional dummy clocks before the first data output comes out.

According to an exemplary embodiment, the reference voltage generating circuit 211 could be a bandgap voltage reference circuit 311 which is turned on while the reference voltage holding circuit 202 302 is under both the standby operation and a read operation.

According to an exemplary embodiment, the current generating circuit 212 may include a first transistor 312 which receives the nbias voltage to generate a first bias (Ibias1) current, a second transistor 313 which generates a second bias (Ibias2) current by mirroring the Ibias1 current, a third transistor 314 which mirrors the Ibias2 current to generate the Ibias3 current which is set to be N times less than a reference (Iref) current of a reference cell 320 of the sense amplifier reference circuit 201 301, a transistor 323 and a transistor 324.

According to an exemplary embodiment, the voltage pull-up circuit 213 may include a first P-type transistor 315 which pulls up the sainr_stby voltage by setting the first P-type transistor 315 to have a width over length ratio to be N times less than a width over length ratio of a corresponding P-type transistor 316 of the sense amplifier reference circuit 301. N could be set to meet the current consumption target for the reference voltage holding circuit 302 during the standby mode. The voltage pull-up circuit 213 may further include a second P-type transistor 317 which has a gate terminal, a drain terminal, and a source terminal. The source terminal could be connected to vdd, the drain terminal could be connected to the first P-type transistor 315, and the gate terminal could be configured to receive a deep power down (dpdown) signal which is kept low to keep the first P-type transistor 315 and the second P-type transistor 317 turned on as long as the reference voltage holding circuit 302 is not deeply powered down (or does not operate under a deep powered down mode). But when operating under the deep powered down mode, the dpdown signal is pulled high to turn off the second P-type transistor 317 so as to turn off the Ibias3 current.

According to an exemplary embodiment, the reference voltage holding circuit 202 may further include a switching circuit 214 configured to decouple the sainr_stby voltage from sainr voltage during a read operation (i.e. active read mode) during which the sainr is driven by the sense amplifier reference circuit 201 301 and not by the reference voltage holding circuit 202 302. But during a standby operation (i.e. standby mode), the switching circuit 214 is turned on to enable to the sainr voltage to be coupled to the sainr_stby voltage so that the sainr voltage is maintained by the sainr_stby voltage.

According to an exemplary embodiment, the sense amplifier reference circuit 201 301 and the main sense amplifier circuit 203 303 have multiple terminals which receive a sense amplifier enable (saeb) signal. The saeb signal is pulled low in a read operation during which the sainr_stby voltage is decoupled from the sainr voltage as the sainr voltage is driven by the sense amplifier reference circuit 201 301 and not by the reference voltage holding circuit 202 302. According to an exemplary embodiment, the sense amplifier reference circuit 201 301 could be connected to multiple main sense amplifier circuits (e.g. 303) resulting in the sainr voltage of the sense amplifier reference circuit 201 301 seeing a large capacitance value.

The principle of operation of FIG. 3 is further elucidated as follows. For the bandgap voltage reference circuit 311, a low power consumption bandgap reference voltage generation (BGR) circuit could be used and would always be enabled under both the standby operation (i.e. standby mode) and a read operation (i.e. an active read mode). The bandgap voltage reference circuit 311 would provide the nbias voltage which is used to generate the Ibias1 current by the first transistor 312. The Ibias1 current is subsequently mirrored by the second transistor 313 into the Ibias2 current which is subsequently mirrored by the third transistor 314 into the Ibias3 current.

The Ibias3 current could be set to be around N times less than Iref, and N could be 100 as an example. In other word, Ibias3=Ibias1=Ibias2=Iref/100, and around $\frac{1}{100}^{th}$ of the Iref current is generated to bias the sainr_stby voltage. Also, it has been determined that the length of the first P-type transistor 315 could be N times longer than the corresponding P-type transistor 316 in the sense amplifier reference circuit 301 in order to have the sainr_stby voltage to be very similar to the sainr voltage when the sense amplifier reference circuit 301 is enabled. However, it should be noted that 100 is just an exemplary number and could be adjusted based on a design change or based on change of the requirement of the sense amplifier circuit 300.

During both the standby mode and the active read mode, the sainr_stby voltage is always on. However, when operating under the standby mode, the sainr_stby voltage is driving sainr voltage which may see a large capacitive loading so as to speed up the ramping up operation by maintain the sainr voltage when transitioning from the standby mode to the active read mode. Essentially, the SAINR holder is to hold node "sainr" while the sense amplifier reference circuit 301 and the main sense amplifier circuit are both off during the standby mode.

When operating under an active read mode, the sainr_stby voltage is to be decoupled from the sainr voltage as the sainr voltage is driven by the sense amplifier reference circuit 301. Such decoupling could be accomplished by the switching circuit 214 which may include a transmission gate 318 and an inverter 319. The P type gate terminal of the transmission gate may receive an idle enable (idleb) signal which is pulled high while the saeb signals are asserted to low. By setting the idleb signal to high, the transmission gate would be turned off so as to decouple the sainr voltage from the sainr_stby voltage. When operating under the standby mode, the idleb signal is asserted low.

When operating under a deep power down mode, the dpdown signal is asserted to high to turn off the second P-type transistor 317 which in turn would result in the Ibias3 being turned off. During the deep-down mode, the sense amplifier reference circuit 301, the reference voltage holding circuit 302, and the main sense amplifier circuit 303 are turned off. When not operating under the deep-down mode, the dpdown signal is asserted low.

In view of the aforementioned descriptions, the disclosure is suitable for being adopted as a part of a read mechanism of a non-volatile memory storage device, and the disclosure may achieve at least one of the following advantages including a lower hardware cost, a lower standby current overhead, and a dissociation between the read speed and the number of sense amplifiers. The lowering of the hardware cost could be achieved by adding one reference voltage holding circuit 302 into a sense amplifier reference circuit (e.g. 301) and one or more main sense amplifier circuit (e.g. 303) without having to divide the main sense amplifier circuits (e.g. 303) into multiple groups to reduce the number of main sense amplifier circuits (e.g. 303) to be served by the sense amplifier reference circuit (e.g. 301) and without having to add an additional dummy clocks before the first data output comes out.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of" multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A reference voltage holding circuit for maintaining a sense amplifier reference voltage provided by a sense amplifier reference circuit, the reference voltage holding circuit comprising:
    a reference voltage generating circuit configured to provide a bias reference voltage;
    a current generating circuit electrically coupled to the reference voltage generating circuit and configured to receive the bias reference voltage to output a standby bias voltage and a standby bias current; and
    a voltage pull-up circuit electrically coupled to the current generating circuit and configured to provide for the standby bias current and to maintain the standby bias voltage which drives the sense amplifier reference voltage when the reference voltage holding circuit operates under a standby operation, approximates the sense amplifier reference voltage as long as the sense amplifier reference circuit remains enabled, and stops driving the sense amplifier reference voltage when the reference voltage holding circuit operates under a read operation.

2. The reference voltage holding circuit of claim 1, wherein the current generating circuit comprising:
    a first transistor which receives the bias reference voltage to generate a first bias current;
    a second transistor which generates a second bias current by mirroring the first bias current; and
    a third transistor which mirrors the second bias current to generate a third bias current which is set to be N times less than a reference current of a reference cell of the sense amplifier reference circuit.

3. The reference voltage holding circuit of claim 2, wherein the voltage pull-up circuit comprising:
    a first P-type transistor which pulls up the standby bias voltage by setting the first P-type transistor to have a width over length ratio to be N times less than a width over length ratio of a corresponding P-type transistor of the sense amplifier reference circuit.

4. The reference voltage holding circuit of claim 3, wherein N is a number which is set to meet a current consumption target of the reference voltage holding circuit during a standby mode.

5. The reference voltage holding circuit of claim 2, wherein the voltage pull-up circuit further comprising a second P-type transistor which comprises a first terminal, a second terminal, and a third terminal, wherein the first terminal is connected to a drain to drain voltage (vdd), a second terminal is connected to the first P-type transistor, and a third terminal is configured to receive a deep power down signal which is kept low as long as the reference voltage holding circuit is not deeply powered down.

6. The reference voltage holding circuit of claim 5, wherein the deep power down signal is pulled high to turn off the second P-type transistor so as to turn off the third bias current.

7. The reference voltage holding circuit of claim 1, wherein the reference voltage generating circuit is a bandgap voltage reference circuit which is turned on while the reference voltage holding circuit is under the standby operation and is also turned on while the reference voltage holding circuit is performing the read operation.

8. The reference voltage holding circuit of claim 1 further comprising:
    a switching circuit configured to decouple the standby bias voltage from the sense amplifier reference voltage during the read operation during which the sense amplifier reference voltage is driven by the sense amplifier reference circuit and not by the reference voltage holding circuit.

9. A sense amplifier circuit comprising:
    a sense amplifier reference circuit configured to generate a sense amplifier reference voltage;
    a main sense amplifier circuit configured to receive the sense amplifier reference voltage and to compare a voltage signal from a memory cell of the main sense amplifier circuit with the sense amplifier reference voltage; and a reference voltage holding circuit configured to maintain the sense amplifier reference voltage when the sense amplifier operates under a standby operation, wherein the reference voltage holding circuit comprising:
- a reference voltage generating circuit configured to provide a bias reference voltage;
- a current generating circuit electrically coupled to the reference voltage generating circuit and configured to receive the bias reference voltage to output a standby bias voltage and a standby bias current; and
- a voltage pull-up circuit electrically coupled to the current generating circuit and configured to provide for the standby bias current and to pull-up the standby bias voltage which drives the sense amplifier reference voltage when the reference voltage holding circuit operates under the standby operation, approximates the sense amplifier reference voltage as long as the sense amplifier reference circuit remains enabled, and stops driving the sense amplifier reference voltage when the reference voltage holding circuit operates under a read operation.

10. The sense amplifier circuit of claim 9, wherein the current generating circuit comprising:
- a first transistor which receives the bias reference voltage to generate a first bias current;
- a second transistor which generates a second bias current by mirroring the first bias current; and
- a third transistor which mirrors the second bias current to generate a third bias current which is set to be N times less than a reference current of a reference cell of the sense amplifier reference circuit.

11. The sense amplifier circuit of claim 10, wherein the voltage pull-up circuit comprising:
- a first P-type transistor which pulls up the standby bias voltage by setting the first P-type transistor to have a width over length ratio to be N times less than a width over length ratio of a corresponding P-type transistor of the sense amplifier reference circuit.

12. The sense amplifier circuit of claim 11, wherein N is a number which is set to meet a current consumption target of the reference voltage holding circuit during a standby mode.

13. The sense amplifier circuit of claim 10, wherein the voltage pull-up circuit further comprising a second P-type transistor which comprises a first terminal, a second terminal, and a third terminal, wherein the first terminal is connected to a drain to drain voltage, a second terminal is connected to the first P-type transistor, and a third terminal is configured to receive a deep power down signal which is kept low as long as the reference voltage holding circuit is not deeply powered down.

14. The sense amplifier circuit of claim 13, wherein the deep power down signal is pulled high to turn off the second P-type transistor so as to turn off the third bias current.

15. The sense amplifier circuit of claim 9, wherein the reference voltage generating circuit is a bandgap voltage reference circuit which is turned on while the reference voltage holding circuit is under the standby operation and is also turned on while the reference voltage holding circuit is performing the read operation.

16. The sense amplifier circuit of claim 9 further comprising:
- a switching circuit configured to decouple the standby bias voltage from the sense amplifier reference voltage during the read operation during which the sense amplifier reference voltage is driven by the sense amplifier reference circuit and not by the reference voltage holding circuit.

17. The sense amplifier circuit of claim 9, wherein the sense amplifier reference circuit and the main sense amplifier circuit receive a sense amplifier enable signal which is pulled low in the read operation during which the standby bias voltage is decoupled from the sense amplifier reference voltage and the sense amplifier reference voltage is driven by the sense amplifier reference circuit and not by the reference voltage holding circuit.

18. The sense amplifier circuit of claim 9, wherein sense amplifier reference circuit is connected to multiple main sense amplifier circuit, and the sense amplifier reference voltage node of the sense amplifier reference circuit has a large capacitance value.

* * * * *